United States Patent
Ikeda

(10) Patent No.: US 7,498,975 B2
(45) Date of Patent: Mar. 3, 2009

(54) PULSE RADAR SYSTEM

(75) Inventor: Hiroshi Ikeda, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/493,634

(22) Filed: Jul. 27, 2006

(65) Prior Publication Data
US 2007/0024493 A1   Feb. 1, 2007

(30) Foreign Application Priority Data
Jul. 28, 2005   (JP) ............................. 2005-218449

(51) Int. Cl.
*G01S 13/08* (2006.01)
*G01S 13/10* (2006.01)
*G01S 13/00* (2006.01)
*G01S 13/93* (2006.01)

(52) U.S. Cl. .................. 342/135; 342/70; 342/89; 342/94; 342/118; 342/134; 342/175; 342/195

(58) Field of Classification Search ................ 342/27, 342/28, 70–72, 118, 134–147, 175, 195, 342/200–205, 82, 89, 94–97
See application file for complete search history.

(56) References Cited

U.S. PATENT DOCUMENTS

| | | | |
|---|---|---|---|
| 2,897,490 A | 7/1959 | Sustein | |
| 4,161,732 A * | 7/1979 | Longuemare, Jr. | .......... 342/201 |
| 4,274,095 A | 6/1981 | Phipps et al. | |
| 4,727,596 A | 2/1988 | Jaffer | |
| 4,870,701 A | 9/1989 | Ito et al. | |
| 5,854,603 A | 12/1998 | Heger | |
| 5,994,965 A | 11/1999 | Davis et al. | |
| 7,002,511 B1 | 2/2006 | Ammar et al. | |
| 2003/0155651 A1 | 8/2003 | Ammar | |

FOREIGN PATENT DOCUMENTS

| | | |
|---|---|---|
| EP | 0 825 455 A2 | 2/1998 |
| JP | A-61-192131 | 8/1986 |
| JP | A-03-138576 | 6/1991 |
| JP | A-05-327354 | 12/1993 |
| JP | A-06-249943 | 9/1994 |
| JP | A-10-319111 | 12/1998 |
| JP | A-2001-264419 | 9/2001 |
| JP | A-2002-311153 | 10/2002 |
| JP | A-2004-080865 | 3/2004 |
| WO | WO 98/04016 | 1/1998 |
| WO | WO99/04284 A1 | 1/1999 |

* cited by examiner

*Primary Examiner*—Bernarr E Gregory
(74) *Attorney, Agent, or Firm*—Oliff & Berridge, PLC

(57) ABSTRACT

A pulse radar system includes: a pulse output circuit that outputs a periodic transmission pulse and a gate pulse having a cycle which is a rational multiple of a cycle of the transmission pulse and is different from a cycle of the transmission pulse; a transmission circuit that generates and sends a transmission pulse wave based on a transmission pulse from the transmission circuit; a transmission antenna that radiates a transmission pulse wave from the transmission circuit; a reception antenna that receives a reception pulse wave reflected from an object in transmission pulse waves from the transmission antenna; a reception circuit that demodulates a reception pulse wave from the reception antenna and outputs a reception pulse; and an extracting circuit that extracts and outputs a reception pulse synchronizing with a gate pulse from the pulse output circuit, among reception pulses from the reception circuit.

9 Claims, 5 Drawing Sheets

PULSE RADAR SYSTEM

BACKGROUND OF THE INVENTION

1. Field of the Invention

The present invention relates to a pulse radar system using a millimeter wave band or a quasi-millimeter wave band, and particularly to a pulse radar system having improvements in distance resolution with respect to a reflective wave from objects in a short distance.

2. Description of the Related Art

Recently, a pulse radar system is used with the purpose of collision avoidance or auto clews. The round-trip distance to an object can be found by multiplying the time that elapses between the radiation of a transmission pulse and the receipt of a reception pulse wave reflected from the object, by light velocity. Consequently, the pulse radar system is intended for calculating the distance to the object by measuring the time that elapses between the radiation of the transmission pulse wave and the receipt of the reception pulse wave from the object.

In this pulse radar system, the transmission pulse wave is radiated, followed by preparation for receiving the reception pulse wave reflected from the object in a short distance. The pulse radar system with the purpose of collision avoidance or auto clews demands exact detection of the positions of objects in a wide range of from tens of centimeters to tens of meters.

When detecting the positions of two or more objects adjacent to each other, the reflected waves from the different objects reach the pulse radar system at substantially the same time. Therefore, in the conventional method for detecting the positions of different objects, the pulse width of a transmission pulse wave is reduced so as to eliminate overlapping between reception pulse waves from the different objects, thereby increasing distance resolution between those objects (for example, refer to Japanese Unexamined Patent Publication No. 6-249943).

SUMMARY OF THE INVENTION

Nevertheless, with the method for increasing distance resolution by using a short pulse, a pulse width of 3 nsec or less is needed for detecting two obstacles one meter apart. That is, transmission pulses are reflected from the two obstacles, respectively, so that the time between these reflected waves is 3 nsec or less. It is therefore necessary to perform sequentially signal processing of their respective reception pulses (for example, when performing signal processing of A/D (analog-digital) conversion) in time intervals as short as 3 nsec. This requires a high-speed circuit, and increases signal processing circuit load.

Reductions in pulse width can improve electrical performance, whereas the signal bandwidth after demodulation is increased, necessitating an amplifier that is wide in the required bandwidth of an intermediate frequency stage. It is difficult to design a wideband amplifier, and handling of pulse-shaped waveforms requires flattening of group delay characteristic, resulting in high costs.

Consequently, the distance resolution improvement with the reductions in pulse width has a limit.

It is desirable to provide a pulse radar system capable of improving distance resolution between objects without requiring speed-up of a reception circuit.

To this end, a reception pulse is extracted in synchronization with a gate pulse having a cycle which is a rational multiple of a cycle of a transmission pulse and is different from the cycle of the transmission pulse.

According to an embodiment of the present invention, there is provided a pulse radar system including: a pulse output circuit outputting a periodic transmission pulse and a gate pulse, the gate pulse having a cycle which is a rational multiple of a cycle of the transmission pulse and is different from the cycle of the transmission pulse; a transmission circuit generating a transmission pulse wave based on a transmission pulse from the pulse output circuit, and outputting the transmission pulse wave generated; a transmission antenna radiating a transmission pulse wave from the transmission circuit; a reception antenna receiving a reception pulse wave, the reception pulse wave being radiated from the transmission antenna as a transmission pulse wave and reflected from an object; a reception circuit demodulating the reception pulse wave from the reception antenna and outputting a reception pulse; and an extracting circuit extracting a reception pulse, which is synchronized with a gate pulse from the pulse output circuit, from among reception pulses from the reception circuit, and outputting the reception pulse extracted.

By extracting the reception pulse that synchronizes with the gate pulse having a cycle which is a rational multiple of a cycle of a transmission pulse and is different from the cycle of the transmission pulse, a time base can be expanded to improve distance resolution between objects without requiring speed-up of the reception circuit.

Preferably, in the above pulse radar system, the pulse output circuit can change the ratio between a cycle of the transmission pulse and a cycle of the gate pulse.

This provides a variable rate of time base expansion, making it possible to select freely distance resolution between objects.

Preferably, in the pulse radar system, the pulse output circuit can change a relative phase between the transmission pulse and the gate pulse.

This permits extraction of a reception pulse in a specific position. Hence, the time base can be shifted by changing the ratio between a cycle of the transmission pulse and a cycle of the gate pulse, and by changing the relative phase between the transmission pulse and the gate pulse. It is therefore possible to extract a reception pulse in a specific position, and select freely a detecting position of the objects on the time base.

Preferably, the pulse radar system is further provided with a distance calculating circuit calculating a distance to the object, based on an elapsed time from when a transmission pulse which immediately precedes a reception pulse extracted by the extracting circuit is outputted from the pulse output circuit until the reception pulse is outputted from the extracting circuit.

This enables calculation of the distances to the objects.

Preferably, the pulse radar system is further provided with a distance calculating circuit calculating a distance to the object based on an elapsed time, a phase of a transmission pulse outputted from the pulse output circuit and a cycle of the transmission pulse at the time when the reception pulse is outputted from the extracting circuit, the elapsed time being from when a transmission pulse is outputted from the pulse output circuit until a reception pulse is outputted from the extracting circuit.

This permits calculation of the distances to the objects.

Preferably, in the pulse radar system, the extracting circuit is configured as a single balanced mixer taking in the gate pulse from the pulse output circuit as a balanced input, and finding a product of the gate pulse and the reception pulse from the reception circuit.

This prevents signal leakage of the gate pulse, thereby improving the accuracy of detecting the objects.

Preferably, the extracting circuit is configured as a double balanced mixer taking in both the gate pulse from the pulse output circuit and the reception pulse from the reception circuit as balanced inputs, and finding a product of the gate pulse and the reception pulse from the reception circuit.

This prevents signal leakage of the gate pulse and the reception pulse, thereby further improving the accuracy of detecting the objects.

Accordingly, the embodiment of the present invention provides the pulse radar system capable of improving distance resolution between objects without requiring speed-up of the reception circuit.

Other and further objects, features and advantages of the invention will appear more fully from the following description.

DESCRIPTION OF THE PREFERRED EMBODIMENTS

Preferred embodiments of the present invention will now be described in detail with reference to the accompanying drawings.

Figure 1:
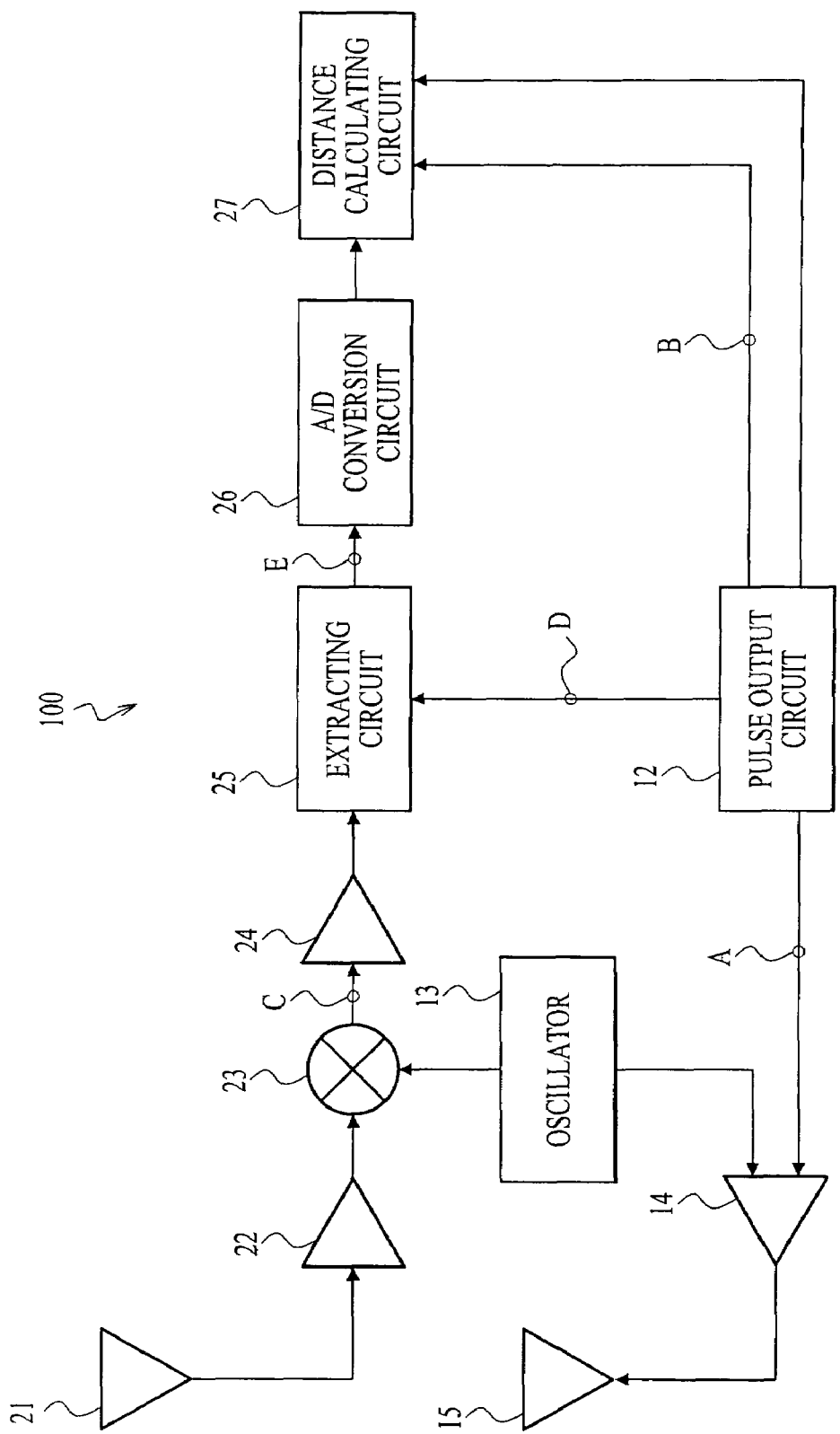
FIG. 1 is a block diagram illustrating an example of an embodiment of a pulse radar system according to the present invention.

FIG. 1 is a block diagram illustrating an example of an embodiment of a pulse radar system according to the present invention. In FIG. 1, reference numeral 12 designates a pulse output circuit that outputs a transmission pulse of a predetermined cycle and a gate pulse having a cycle which is a rational multiple of a cycle of a transmission pulse and is different from the cycle of the transmission pulse. Reference numeral 13 designates an oscillator that oscillates in a modulation frequency. Reference numeral 14 designates a modulation circuit that generates a transmission pulse wave based on a transmission pulse. Reference numeral 15 designates a transmission antenna that radiates a transmission pulse wave. Reference numeral 21 designates a reception antenna that receives a reception pulse wave from an object. Reference numeral 22 designates a low noise amplifier that amplifies a reception pulse wave. Reference numeral 23 designates a demodulation circuit that demodulates a reception pulse wave. Reference numeral 24 designates an IF (intermediate frequency) amplifier that amplifies a reception pulse outputted from the demodulation circuit. Reference numeral 25 designates an extracting circuit that extracts a reception pulse synchronizing with a gate pulse among reception pulses. Reference numeral 26 designates an A/D conversion circuit that performs A/D (analog-digital) conversion of a reception pulse. Reference numeral 27 designates a distance calculating circuit that calculates the distance to an object.

A transmission circuit includes the oscillator 13 and the modulation circuit 14. A reception circuit includes the low noise amplifier 22, the oscillator 13, the demodulation circuit 23, and the IF amplifier 24.

The configuration of a sending system of a pulse radar system 100 will be described with reference to FIG. 1. The pulse output circuit 12 generates a transmission pulse at predetermined generation intervals. It is preferable that the generation intervals of the transmission pulse is set to be longer than the round-trip wave propagation time corresponding to a maximum detection distance of the pulse radar system 100. The pulse output circuit 12 outputs a gate pulse having a cycle which is a rational multiple of a cycle of a transmission pulse and is different from the cycle of the transmission pulse. The gate pulse is inputted to the extracting circuit 25 to be described later. At this time, the pulse output circuit 12 can change the ratio between a cycle of a transmission pulse and a cycle of a gate pulse, and also change the relative phase between the transmission pulse and the gate pulse. Further, the pulse output circuit 12 outputs a synchronized pulse that synchronizes with a transmission pulse, so that it is used as a start trigger when the distance to an object is calculated on the distance calculating circuit 27 to be described later.

The modulation circuit 14 outputs a transmission pulse wave by mixing a transmission pulse from the pulse outputting circuit 12 and a modulation wave from the oscillator 13.

The transmission antenna 15 radiates a transmission pulse wave from the modulation circuit 14. The transmission antenna 15 may be made up of a plurality of antennas.

The configuration of a receiving system of the pulse radar system 100 will be described with reference to FIG. 1. The reception antenna 21 receives a reception pulse wave reflected from an object. The reception antenna 21 may also be made up of a plurality of antennas. Alternatively, a transmitter-receiver antenna may be used.

The demodulation circuit 23 demodulates a reception pulse wave amplified by the low noise amplifier 22, and then outputs a reception pulse. At the time of demodulation, for example, there may be applied a detection mode that can be realized by a usual technique of synchronous detection, and asynchronous detection such as envelope demodulation. In the present embodiment, the oscillator 13 generates local signals in a frequency band used in the pulse radar system 100, and the synchronous detection is performed based on the local signals generated.

The extracting circuit 25 extracts a reception pulse that synchronizes with a gate pulse from the pulse output circuit 12, among reception pulses demodulated by the demodulation circuit 23 and then amplified by the IF amplifier 24. Preferably, the extracting circuit 25 is configured as a single balanced mixer taking in a gate pulse from the pulse output circuit 12 as a balanced input. More preferably, the extracting circuit 25 is configured as a double balanced mixer taking in both a gate pulse from the pulse output circuit 12 and a reception pulse from the demodulation circuit 23 as balanced inputs. The single balanced mixer can prevent signal leakage of a gate pulse, as described later. The double balanced mixer can prevent signal leakage of a gate pulse and a reception pulse, as described later.

Figure 4:
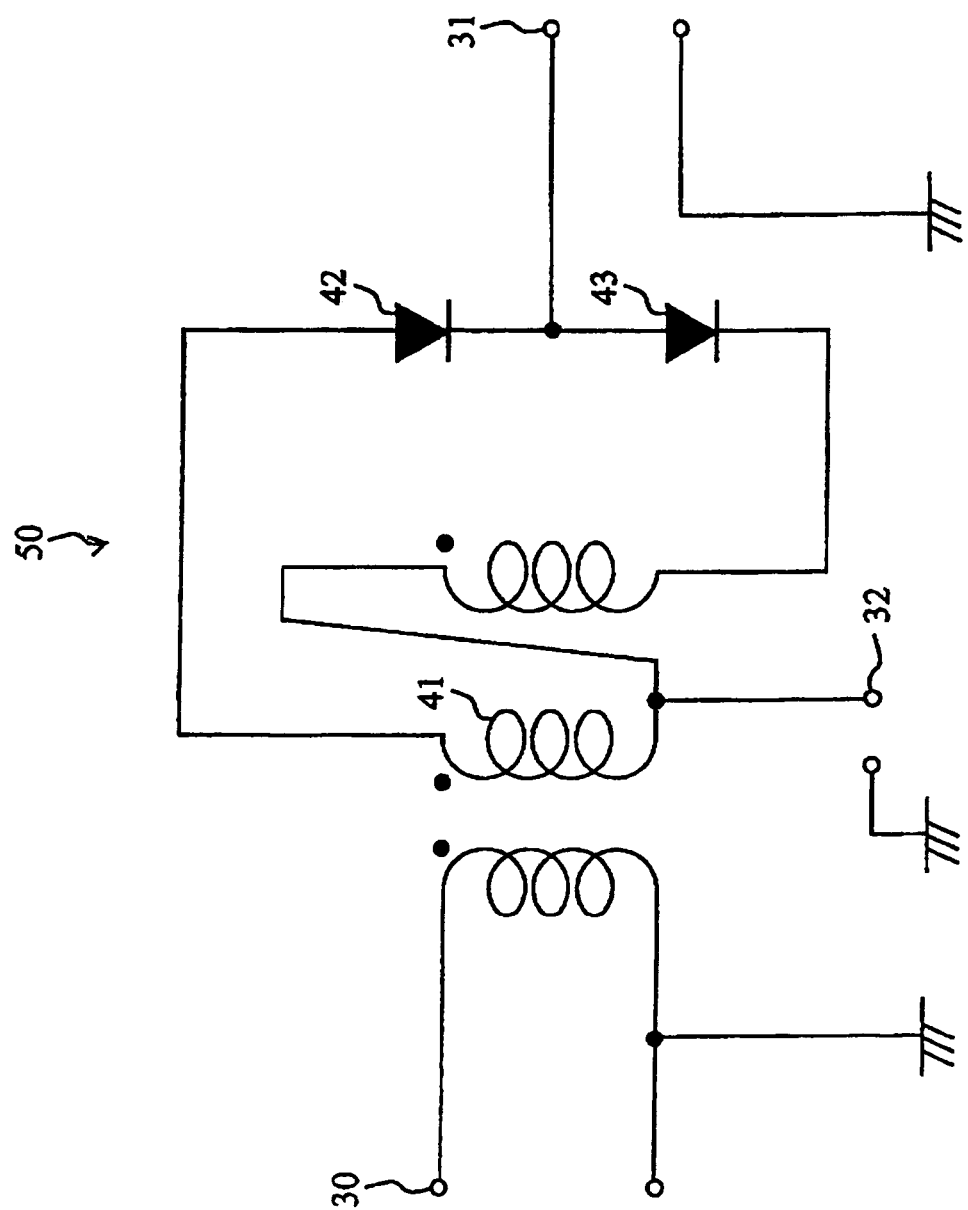
FIG. 4 is a block diagram illustrating an example of the configuration of a single balanced mixer.

An example of specific configuration of the single balanced mixer will be described below with reference to FIG. 4. In FIG. 4, reference numeral 30 designates an input port, to which a gate pulse is inputted. Reference numeral 31 designates an input port, to which a reception pulse from the demodulation circuit 23 is inputted. Reference numeral 32 designates an output port that outputs a reception pulse to the timing of a gate pulse. Reference numeral 41 designates a toroidal core that induces current by an input of a gate pulse. Reference numerals 42 and 43 are diodes that switch electrical continuity by an input of a gate pulse.

In the single balanced mixer 50, the diodes 42 and 43 establish electrical continuity by an input of a gate pulse to the input port 30, so that a reception pulse synchronizing with a gate pulse among reception pulses inputted to the input port 31 can be outputted from the output port 32. That is, the single balanced mixer 50 finds the product of the gate pulse to the input port 30 and the reception pulse to the input port 31, and from among reception pulses inputted to the input port 31, extracts a reception pulse synchronizing with the gate pulse inputted to the input port 30, and then outputs the reception pulse from the output port 32.

On the other hand, the output port 32 corresponds to a middle point of the toroidal core 41, so that the potential of a gate pulse inputted to the input port 30 causes no potential in the output port 32. Therefore, in the single balanced mixer 50, the gate pulse can be balanced so as to prevent signal leakage of the gate pulse to the output port 32. This improves the accuracy of detecting objects.

Figure 5:
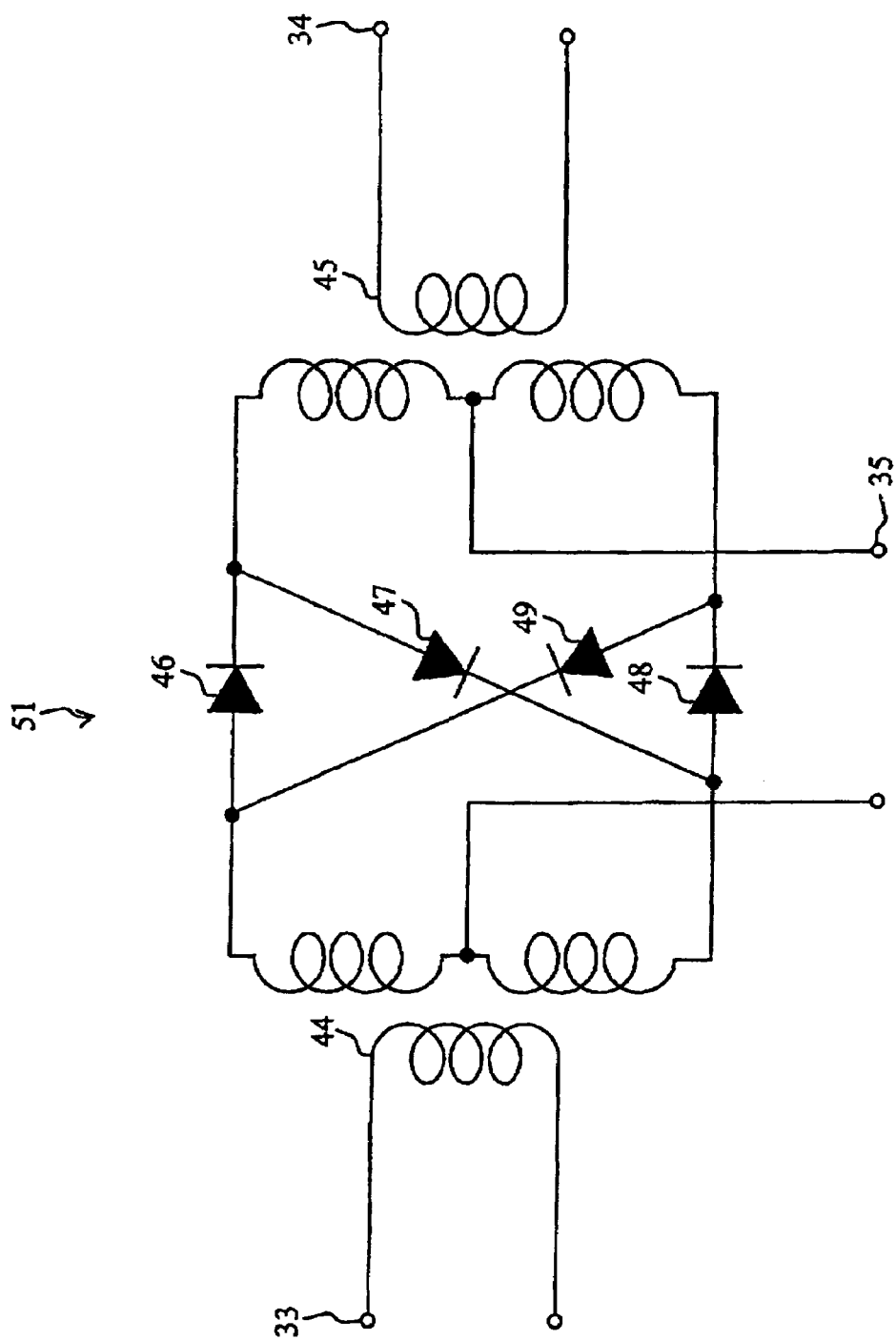
FIG. 5 is a block diagram illustrating an example of the configuration of a double balanced mixer.

An example of the specific configuration of a double balanced mixer will be described with reference to FIG. 5. In FIG. 5, reference numeral 33 designates an input port, to which a gate pulse is inputted. Reference numeral 34 designates an input port, to which a reception pulse from the demodulation circuit 23 is inputted. Reference numeral 35 designates an output port that outputs a reception pulse to the timing of a gate pulse. Reference numeral 44 designates a toroidal core that induces current by an input of a gate pulse. Reference numeral 45 designates a toroidal core that induces current by an input of a reception pulse. Reference numerals 46 to 49 are diodes that perform switching of an input of a gate pulse.

In the double balanced mixer 51, the diodes 46 and 47, and the diodes 48 and 49 alternately establish electrical continuity by an input of a gate pulse to the input port 33. The diodes 46 and 47, and the diodes 48 and 49 alternately establish electrical continuity by an input of a reception pulse to the input port 34. Therefore, the double balanced mixer 51 causes the output port 35 to generate an output only when a gate pulse inputted to the input port 33 synchronizes with a reception pulse inputted to the input port 34. That is, the double balanced mixer 51 finds the product of the gate pulse to the input port 33 and the reception pulse to the input port 34, and from among reception pulses inputted to the input port 34, extracts a reception pulse synchronized with the gate pulse inputted to the input port 33, and then outputs the reception pulse from the output port 35.

On the other hand, the output port 35 corresponds to a middle point of the toroidal cores 44 and 45, so that neither the gate pulse inputted to the input port 33 nor the reception pulse inputted to the input port 34 causes a potential in the input port 33. Therefore, in the double balanced mixer 51, both of the gate pulse and the reception pulse can be balanced so as to prevent signal leakage of the gate pulse and the reception pulse to the output port 35. This further improves the accuracy of detecting objects.

The distance calculating circuit 27 shown in FIG. 1 calculates the distance from the pulse radar system 100 to an object, based on a reception pulse that is outputted from the extracting circuit 25 and subjected to A/D conversion by the A/D conversion circuit 26, and on a start trigger from the pulse output circuit 12.

The operations of the extracting circuit 25 and the distance calculating circuit 27 will be described below with reference to FIGS. 2A to 2E. FIGS. 2A, 2B, 2C, 2D and 2E show examples of the timings of signal waveforms at the points A, B, C, D, and E in FIG. 1, respectively. In these drawings, the pulse widths of the respective signals are omitted, and the solid lines indicate the original signals, and the broken lines indicate signals which are obtained by changing the phase and the ratio of a transmission pulse and a gate pulse, respectively. In the following description, like parts are identified by the same reference numerals as in FIG. 1.

Figure 2:
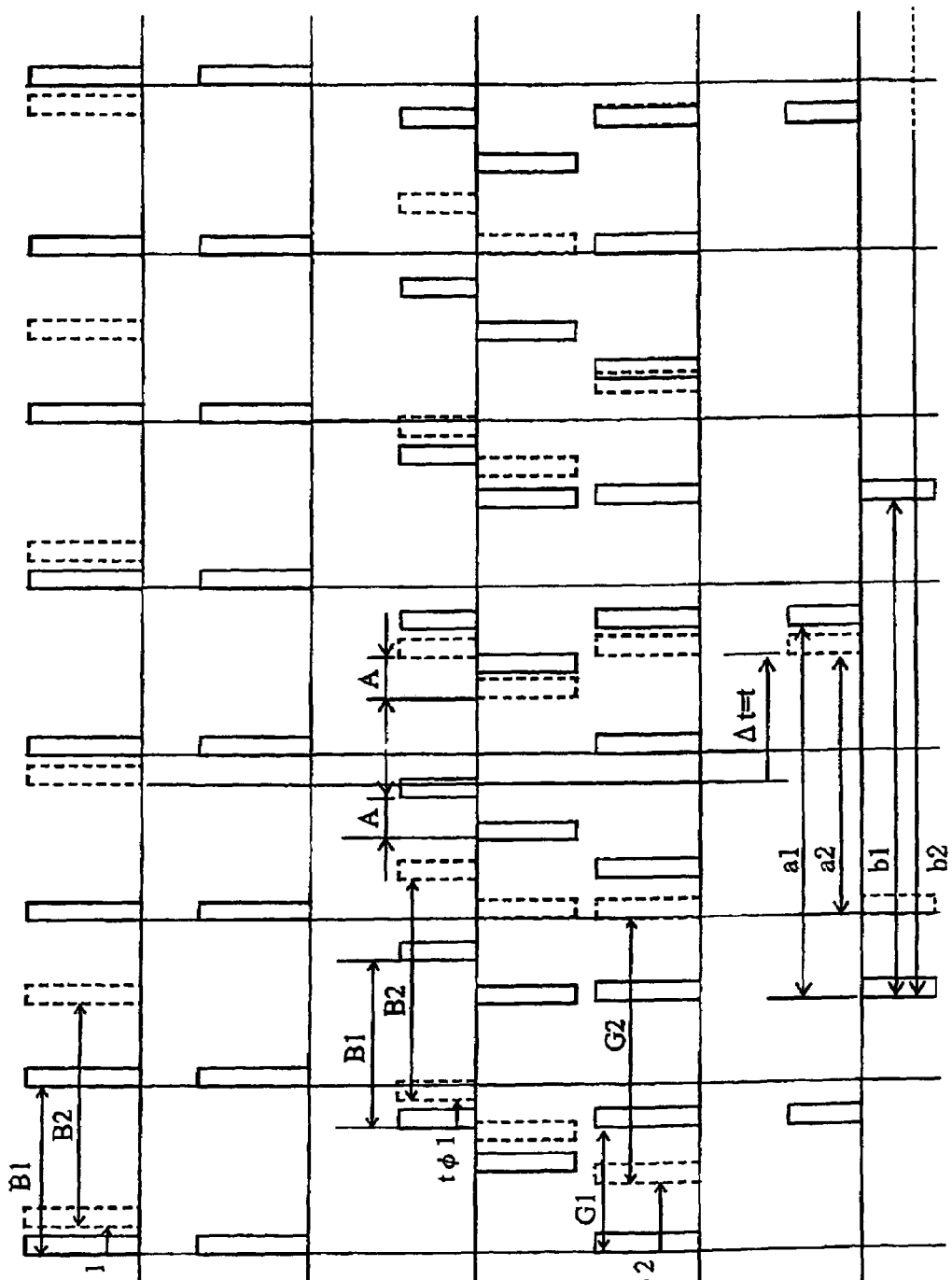
FIGS. 2A to 2E are diagrams illustrating an example of the operation of the pulse radar system.

FIG. 2A indicates a transmission pulse that the pulse output circuit 12 outputs to the modulation circuit 14. The sending intervals of the transmission pulse is set to be longer than the round-trip propagation time corresponding to the maximum detection distance of the pulse radar system 100, as described above. Preferably, the pulse width of the transmission pulse is shorter than the time corresponding to the distance resolution between objects. FIG. 2B indicates a start trigger that the pulse output circuit 12 outputs to the distance calculating circuit 27. This start trigger is synchronized with the transmission pulse. In the embodiment shown in FIGS. 2A to 2E, it is adapted to output the start trigger having the same cycle as the transmission pulse as shown in FIG. 2A.

FIG. 2C indicates reception pulses outputted from the demodulation circuit 23. Since these reception pulses are ones outputted from the pulse radar system 100 and reflected from the objects and then received, they are outputted with a delay with respect to the timing of the transmission pulse in FIG. 2A. The configuration in FIGS. 2A to 2E illustrates a case where there are two objects. For ease in understanding, the reception pulse from the object closer to the pulse radar system 100 is plotted downward as viewed in the drawings, and the reception pulse from the remote object is plotted upward.

FIG. 2D indicates a gate pulse outputted from the pulse output circuit 12 to the extracting circuit 25. The gate pulse has a cycle which is a rational multiple of a cycle of a transmission pulse shown in FIG. 2A and is different from the cycle of the transmission pulse. In this embodiment, with regard to the original signal, a cycle of the transmission pulse is set to four in number, and a cycle of the gate pulse is set to three in number. That is, during the time elapsed from the initial synchronization between the transmission pulse and the gate pulse until the next synchronization, there are three outputs of the transmission pulse, and four outputs of the gate pulse. FIG. 2E indicates reception pulses extracted by and outputted from the extracting circuit 25.

If outputted the gate pulse having a cycle which is a rational multiple of a cycle of the transmission pulse shown in FIG. 2A and is different from the cycle of the transmission pulse, in some cases, reception pulses outputted from the demodulation circuit 23 may contain ones synchronizing with the gate pulse. Therefore, the extracting circuit 25 employs the balanced mixer as described above, to finds the product of the gate pulse in FIG. 2D and the reception pulses in FIG. 2C, so that only the reception pulse synchronizing with the gate pulse can be extracted periodically. By extracting the reception pulse in this manner, a cycle of the reception pulse can be expanded from a cycle B1 in FIG. 2C to a cycle b1 in FIG. 2E. Likewise, a time difference between the reception pulses from the two objects can also be expanded from a time difference A to a time difference a1. Hence, when detecting different objects adjacent to each other, the time base can be expanded to improve distance resolution by extracting the reception pulse synchronizing with the gate pulse, without requiring speed-up of the reception circuit.

In the present embodiment, the ratio between the transmission pulse shown in FIG. 2A and the gate pulse shown in FIG. 2D is 4 to 3. Therefore, letting a cycle of the transmission pulse in FIG. 2A be B1, a cycle b1 of the reception pulse in FIG. 2E corresponds to expansion that is equivalent to three times a cycle B1. A time difference a1 between the reception pulses from the two objects can also be expanded to three times a time difference A. In the present embodiment, the ratio between a cycle B1 of the transmission pulse and a cycle G1 of the gate pulse is 4 to 3 (the ratio between a cycle of the transmission pulse and a cycle of the gate pulse is 3/4, that is 33%). On the other hand, when the ratio between a cycle of the transmission pulse and a cycle of the gate pulse is α to β, wherein α and β are prime positive integers each other, (the ratio of a cycle of the gate pulse to a cycle of the transmission pulse is β/α), a cycle of the reception pulse and the time difference between reception pulses from the two objects can be expanded to β times the original signal, respectively.

The following is a case where a cycle of the transmission pulse in FIG. 2A is shifted from a cycle B1 to a cycle B2, and the phase of the transmission pulse is shifted by the amount of a time difference tφ1 when phase is expressed in terms of time; and a cycle of the gate pulse in FIG. 2D is shifted from a cycle G1 to a cycle G2, and the phase of the gate pulse is shifted by the amount of a time difference tφ2 when phase is expressed in terms of time.

When a cycle of the transmission pulse in FIG. 2A is changed, and the phase of the transmission pulse is shifted, it follows that a cycle of the reception pulse is changed from a cycle B1 to a cycle B2, and the phase of the reception pulse is shifted by the amount of the time difference tφ1, as shown in FIG. 2C. Here, the intervals of the reception pulses from the two objects remain unchanged. Also in this case, when the gate pulse having a cycle which is a rational multiple of a cycle of the transmission pulse in FIG. 2A and is different from a cycle of the transmission pulse is outputted from the pulse output circuit 12, in some cases, the reception pulses outputted from the demodulation circuit 23 may contain ones synchronizing with the gate pulse. It is therefore possible to periodically extract only the reception pulse synchronizing with the gate pulse shown in FIG. 2D. A cycle of the reception pulse can be expanded from a cycle B2 in FIG. 2C to a cycle b2 in FIG. 2E. Likewise, the time difference between the reception pulses from the two objects can also be expanded from the time difference A to a time difference a2.

Thus, a cycle B2 of the reception pulse is determined by the ratio between the transmission pulse shown in FIG. 2A and a cycle of the gate pulse shown in FIG. 2D. Therefore, the rate of time base expansion is variable by changing the ratio between a cycle of the transmission pulse and a cycle of the gate pulse. Hence, the distance resolution between the objects can be selected freely.

On the other hand, when the relative phase between the transmission pulse in FIG. 2A and the gate pulse shown in FIG. 2D is changed, either one of the reception pulses shown in FIG. 2C can be extracted at a different position from that before changing the phase, so that the time base can be shifted. This enables extraction of the reception pulse at a specific position, and free selection of the detection position of the objects on the time base.

When the ratio between a cycle of the transmission pulse shown in FIG. 2A and a cycle of the gate pulse shown in FIG. 2D is changed, and the relative phase between the transmission pulse and the gate pulse shown in FIG. 2D is changed, the time base of the specific position can be expanded and the distance resolution can be selected freely, and the detection position of the objects on the time base can be selected freely by shifting the time base while maintaining the selected distance resolution, and then extracting the reception pulse at the specific position. As described above, the ratio between a cycle of the transmission pulse and a cycle of the gate pulse can be changed within the pulse output circuit 12. The relative phase between the transmission pulse and the gate pulse can be changed within the pulse output circuit 12. The ratio between a cycle of the transmission pulse and a cycle of the gate pulse can also be changed, for example, by disposing a frequency multiplier (not shown) and a frequency divider (not shown) on the exterior of the pulse output circuit 12 so as to input either the transmission pulse or the gate pulse to the frequency multiplier and the frequency divider. The relative phase between the transmission pulse and the gate pulse can also be changed, for example, by disposing a delay circuit (not shown) on the exterior of the pulse output circuit 12 so as to input either the transmission pulse or the gate pulse to the delay circuit.

The distance calculating circuit 27 calculates a distance to the object based on an elapsed time (a time difference Δt) from when a transmission pulse immediately before a reception pulse extracted by the extracting circuit 25 is outputted from the pulse output circuit 12 until the reception pulse is outputted from the extracting circuit 25. This time corresponds to a round-trip propagation time t of a transmission pulse wave sent from the pulse radar system 100. In this case, the start trigger shown in FIG. 2B is sequentially updated and stored in a memory (not shown) on the distance calculating circuit 27. When a reception pulse is outputted from the extracting circuit 25, a time difference Δt between the timing of the start trigger stored in the memory and the timing of the output of the reception pulse is measured and converted into a distance to the objects. Here, the distance to the objects can be calculated by multiplying the time difference Δt by light velocity and then dividing by 2.

In the calculation of the distance to the objects, the time taken to acquire the reception pulse outputted from the extracting circuit 25 may be compensated within the distance calculating circuit 27, in consideration of delay time on the transmission circuit and the reception circuit within the pulse radar system 100.

Figure 3:
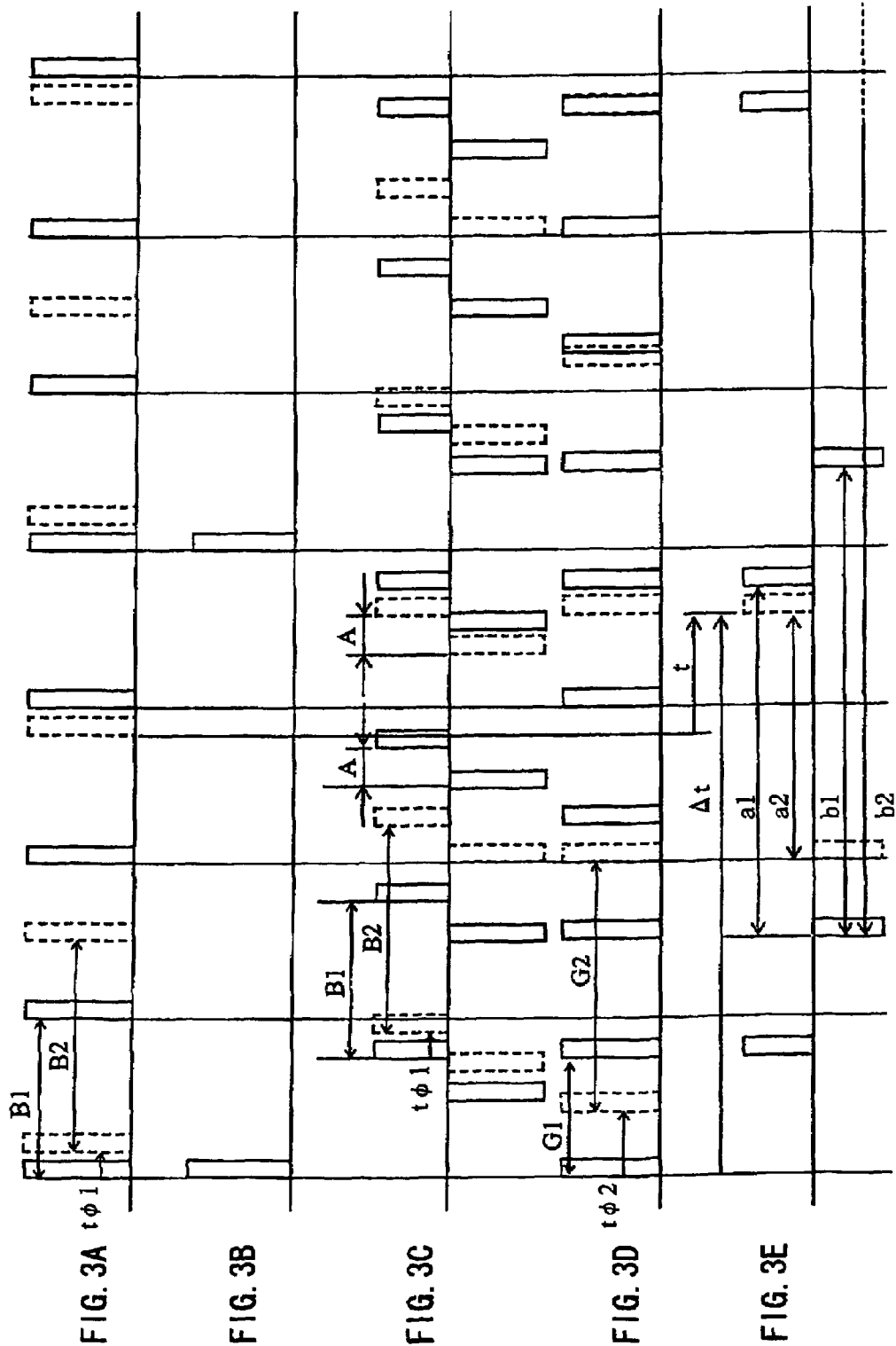
FIGS. 3A to 3E are diagrams illustrating another example of the operation of the pulse radar system.

Another embodiment of the operations of the extracting circuit 25 and the distance calculating circuit 27 will be described below with reference to FIGS. 3A to 3E. FIGS. 3A, 3B, 3C, 3D and 3E show examples of the timings of signal waveforms at the points A, B, C, D, and E in FIG. 1, respectively. In these drawings, the pulse widths of the respective signals are omitted, and the solid lines indicate the original signals, and the broken lines indicate signals which are obtained by changing the phases and the ratio of a transmission pulse and a gate pulse, respectively. In the following description, like parts are identified by the same reference numerals as in FIG. 1. The signals used in this embodiment are the same as those described with reference to FIGS. 2A to 2E, except for the timing of a start trigger as shown in FIG. 3B. Therefore, the operation of the distance calculating circuit 27 is different from, and the operation of the extracting circuit 25 is the same as the operation described with reference to FIGS. 2A to 2E. For this reason, only the operation of the distance calculating circuit 27 will be described below.

The start trigger shown in FIG. 3B is synchronized with a transmission pulse. In the embodiment shown in FIGS. 3A to 3E, a start trigger of a cycle that is four times a transmission pulse shown in FIG. 3A is outputted from the pulse output circuit 12. A cycle of the start trigger may be any times a cycle of the transmission pulse, as far as it is different from a cycle of the transmission pulse.

Since in this embodiment, as shown in FIG. 3B, a cycle of the start trigger is different from a cycle of the transmission pulse shown in FIG. 3A, a time difference Δt measured with the distance calculating circuit 27 is different from a round-trip propagation time t to be measured originally. The time difference Δt is measured depending on the number of pulses of the transmission pulse that can be contained from the timing of the start trigger shown in FIG. 3B until the timing for extracting the reception pulse shown in FIG. 3E, and on the shift amount of the phase of the transmission pulse during that time. This enables the distance calculating circuit 27 to calculate the distance to the objects, based on an elapsed time (a time difference Δt) from when the transmission pulse shown in FIG. 3A is outputted from the pulse output circuit 12 until the reception pulse shown in FIG. 3E is outputted from the extracting circuit 25, and based on the phase of the transmission pulse outputted from the pulse output circuit 12, and on a cycle B2 of the transmission pulse when the extracting circuit 25 outputs the reception pulse. In this case, information about the shift amount of the phase of the transmission pulse and a cycle of the transmission pulse are separately inputted from the pulse output circuit 12 to the distance calculating circuit 27.

In case of measuring a time difference Δt, the start trigger shown in FIG. 3B is sequentially updated and stored in a memory (not shown) on the distance calculating circuit 27. When a reception pulse is outputted from the extracting circuit 25, a time difference Δt between the timing of the start trigger stored in the memory and the timing of the output of the reception pulse is measured. In the embodiment shown in FIGS. 3A to 3E, a round-trip propagation time t can be calculated on the distance calculating circuit 27 in the following manner. That is, a time difference tϕ1, which is obtained by converting the shift amount of the phase of the transmission pulse into time, is subtracted from a time difference Δt, and then divided by a cycle B2 of the transmission pulse. The resulting remainder is the round-trip propagation time t. Here, the distance to the objects can be calculated by multiplying the time difference Δt by light velocity and then dividing by 2.

In the calculation of the distance to the objects, the time taken to acquire the reception pulse outputted from the extracting circuit 25 may be compensated within the distance calculating circuit 27, in consideration of delay time on the transmission circuit and the reception circuit within the pulse radar system 100.

The pulse radar system of the present invention is applicable to on vehicle equipments with the purpose of collision avoidance or auto clews, and is also usable as a stationary pulse radar system.

While the preferred embodiments of the present invention have been illustrated in detail, it should be apparent that modifications and improvements may be made to the invention without departing from the spirit and scope of the invention as described in the following claims.

What is claimed is:

1. A pulse radar system comprising:
a pulse output circuit outputting a periodic transmission pulse and a gate pulse, the gate pulse having a cycle which is a rational multiple of a cycle of the transmission pulse and is different from the cycle of the transmission pulse;
a transmission circuit generating a transmission pulse wave based on a transmission pulse from the pulse output circuit, and outputting the transmission pulse wave generated;
a transmission antenna radiating a transmission pulse wave from the transmission circuit;
a reception antenna receiving a reception pulse wave, the reception pulse wave being radiated from the transmission antenna as a transmission pulse wave and reflected from an object;
a reception circuit demodulating the reception pulse wave from the reception antenna and outputting a reception pulse;
an extracting circuit extracting a reception pulse, which is synchronized with a gate pulse from the pulse output circuit, from among reception pulses from the reception circuit, and outputting the reception pulse extracted; and
a distance calculating circuit calculating a distance to the object based on an elapsed time, a phase of a transmission pulse outputted from the pulse output circuit and a cycle of the transmission pulse at the time when the reception pulse is outputted from the extracting circuit, the elapsed time being from when a transmission pulse is outputted from the pulse output circuit until a reception pulse is outputted from the extracting circuit.

2. The pulse radar system according to claim 1 wherein, the pulse output circuit changes a ratio between a cycle of the transmission pulse and a cycle of the gate pulse.

3. The pulse radar system according to claim 1 wherein, the pulse output circuit changes a relative phase between the transmission pulse and the gate pulse.

4. The pulse radar system according to claim 1 wherein, the extracting circuit is configured as a single balanced mixer taking in the gate pulse from the pulse output circuit as a balanced input, and finding a product of the gate pulse and the reception pulse from the reception circuit.

5. A pulse radar system comprising:
a pulse output circuit outputting a periodic transmission pulse and a gate pulse, the gate pulse having a cycle which is a rational multiple of a cycle of the transmission pulse and is different from the cycle of the transmission pulse;
a transmission circuit generating a transmission pulse wave based on a transmission pulse from the pulse output circuit, and outputting the transmission pulse wave generated;
a transmission antenna radiating a transmission pulse wave from the transmission circuit;
a reception antenna receiving a reception pulse wave, the reception pulse wave being radiated from the transmission antenna as a transmission pulse wave and reflected from an object;
a reception circuit demodulating the reception pulse wave from the reception antenna and outputting a reception pulse; and
an extracting circuit extracting a reception pulse, which is synchronized with a gate pulse from the pulse output circuit, from among reception pulses from the reception circuit, and outputting the reception pulse extracted, wherein
the extracting circuit is configured as a double balanced mixer taking in both the gate pulse from the pulse output circuit and the reception pulse from the reception circuit as balanced inputs, and finding a product of the gate pulse and the reception pulse from the reception circuit.

6. The pulse radar system according to claim 5, further comprising:
a distance calculating circuit calculating a distance to the object based on an elapsed time, the time being from when a transmission pulse which immediately precedes a reception pulse extracted by the extracting circuit is outputted from the pulse output circuit until the reception pulse is outputted from the extracting circuit.

7. The pulse radar system according to claim 5, further comprising:

a distance calculating circuit calculating a distance to the object based on an elapsed time, a phase of a transmission pulse outputted from the pulse output circuit and a cycle of the transmission pulse at the time when the reception pulse is outputted from the extracting circuit, the elapsed time being from when a transmission pulse is outputted from the pulse output circuit until a reception pulse is outputted from the extracting circuit.

8. The pulse radar system according to claim 5 wherein, the pulse output circuit changes a ratio between a cycle of the transmission pulse and a cycle of the gate pulse.

9. The pulse radar system according to claim 5 wherein, the pulse output circuit changes a relative phase between the transmission pulse and the gate pulse.

* * * * *